(12) United States Patent
Lin

(10) Patent No.: US 11,393,868 B2
(45) Date of Patent: Jul. 19, 2022

(54) IMAGE SENSOR AND METHOD FOR MANUFACTURING DEEP TRENCH AND THROUGH-SILICON VIA OF THE IMAGE SENSOR

(71) Applicant: SHANGHAI IC R&D CENTER CO., LTD., Shanghai (CN)

(72) Inventor: Hong Lin, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 239 days.

(21) Appl. No.: 16/966,166

(22) PCT Filed: Aug. 29, 2018

(86) PCT No.: PCT/CN2018/102978
§ 371 (c)(1),
(2) Date: Jul. 30, 2020

(87) PCT Pub. No.: WO2019/153725
PCT Pub. Date: Aug. 15, 2019

(65) Prior Publication Data
US 2021/0036048 A1 Feb. 4, 2021

(30) Foreign Application Priority Data

Feb. 12, 2018 (CN) .......................... 201810144446.X

(51) Int. Cl.
*H01L 27/00* (2006.01)
*H01L 27/146* (2006.01)

(52) U.S. Cl.
CPC .. *H01L 27/14687* (2013.01); *H01L 27/14636* (2013.01); *H01L 27/14689* (2013.01)

(58) Field of Classification Search
CPC ......... H01L 27/14687; H01L 27/14636; H01L 27/14689
See application file for complete search history.

(56) References Cited

U.S. PATENT DOCUMENTS 8,698,934 B2 * 4/2014 Hagiwara ......... H01L 27/14689
348/308
9,214,488 B2 * 12/2015 Inoue ................ H01L 27/14641
(Continued)

*Primary Examiner* — Mounir S Amer
*Assistant Examiner* — Alexander Belousov
(74) *Attorney, Agent, or Firm* — TIANCHEN LLC.; Yuan R. Li; Yi Fan Yin

(57) ABSTRACT

The present disclosure provides an image sensor and a method for manufacturing deep trench and through-silicon via of the image sensor, wherein: providing a pixel silicon wafer, performing a silicon wafer thinning on a second side of the pixel silicon wafer; forming a deep trench on the the second side of the pixel silicon wafer; filling the deep trench with organic material; coating photoresist on the second side of the pixel silicon wafer; etching the second side of the pixel silicon wafer to form a through-silicon via according to the through-silicon via pattern; depositing a dielectric protective layer on the surface of the deep trench and the surface of the through-silicon via; filling the deep trench with organic material; coating the photoresist on the second side of the pixel silicon wafer; etching the second side of the pixel silicon wafer to form a contact hole according to the contact hole pattern, depositing a barrier layer on the surface of the deep trench and the surface of the through-silicon via, filling the deep trench with a first metal, and form a seed layer on the surface of the through-silicon via; filling the through-silicon via with the first metal. The present disclosure reduces production steps of the image sensor.

10 Claims, 5 Drawing Sheets

(56) References Cited

U.S. PATENT DOCUMENTS

| | | | |
|---|---|---|---|
| 9,437,645 B1* | 9/2016 | Chou | H01L 27/14645 |
| 10,658,296 B2* | 5/2020 | Wu | H01L 23/53223 |
| 2012/0242876 A1* | 9/2012 | Hagiwara | H01L 27/14689 |
| | | | 257/443 |
| 2014/0077271 A1* | 3/2014 | Fujii | H01L 31/18 |
| | | | 438/59 |
| 2017/0208277 A1* | 7/2017 | Borthakur | H04N 5/378 |
| 2017/0330852 A1* | 11/2017 | Kataoka | H01L 24/98 |
| 2018/0047768 A1* | 2/2018 | Suzuki | H01L 27/1463 |
| 2018/0096936 A1* | 4/2018 | Wu | H01L 27/14614 |
| 2018/0158860 A1* | 6/2018 | Roy | H01L 27/14634 |
| 2019/0043910 A1* | 2/2019 | Miyazawa | H04N 5/379 |
| 2019/0131349 A1* | 5/2019 | Im | H01L 27/14645 |
| 2020/0119096 A1* | 4/2020 | Uhm | H01L 51/442 |
| 2021/0036048 A1* | 2/2021 | Lin | H01L 27/1463 |
| 2022/0149093 A1* | 5/2022 | Kimizuka | H01L 21/823412 |

* cited by examiner

IMAGE SENSOR AND METHOD FOR MANUFACTURING DEEP TRENCH AND THROUGH-SILICON VIA OF THE IMAGE SENSOR

CROSS-REFERENCE TO RELATED APPLICATION

This application claims priority of International Patent Application Serial No. PCT/CN2018/102978, filed Aug. 29, 2018, which is related to and claims priority of Chinese patent application Serial No. 201810144446.X, filed Feb. 12, 2018. The entirety of each of the above-mentioned patent applications is hereby incorporated herein by reference and made a part of this specification.

TECHNICAL FIELD

The present disclosure relates to the field of semiconductor technology, in particular to an image sensor and a method for manufacturing deep trench and through-silicon via of the image sensor.

BACKGROUND

With popularity of smartphones and tablets, demand of CIS (CMOS Image Sensor) products increases day by day. Pixels of cameras of the smartphones are configured as at least 3 megapixels, and pixels of cameras of some high-end smartphones are even set as 10 megapixels or more.

Application of the high-end products requires higher performance parameters of CIS products, including pixel, resolution, power consumption and physical size. Therefore, in order to support requirements of cameras of the high-end smartphones, many CIS suppliers are focusing on development of back-side illuminated CMOS image sensor (BSI CIS) to improve the sensitivity of the CIS products and reduce interference between pixel signals.

Research of the back-side illuminated image sensor is focus on 3D CIS technology. An image sensor chip and a digital signal processor chip are vertically interconnected through TSV (Through-Silicon Via) process, which reduce package size and power consumption effectively.

At present, the mass produced 3D CIS product process is as follows: a pixel silicon wafer and a numerical controlled silicon wafer are vertically bonded by direct bonding process of SiO2—SiO2; backside thinning technology is carried out to the pixel silicon wafer, and thickness of thinned silicon is close to photosensitive region that has been implanted; DTI (Deep Trench Isolation) process is carried out between photosensitive units (pixel units) on the backside of the pixel silicon wafer, filling the deep trench with dielectric and metal successively to achieve electrical isolation and optical isolation between the photosensitive units. TSV (Through-Silicon Via) process is carried out to controlled circuit area next to pixel array, and connects first metal layer of the pixel silicon wafer and top metal layer of the numerical control chip respectively; metal grid process is performed between the photosensitive units, and metal grid absorbs stray light to reduce signal interference; The TSV is led out by aluminum wiring to form aluminum welding pad for packaging; in the photosensitive region, color filter films are formed successively for transmitting different visible lights, and finally a microlens is formed above the color filter films.

In prior DTI (Deep-Trench Isolation) technology, some are filled with dielectric to form electrical isolation between pixels, and some are filled with dielectric and metal successively to form electrical isolation and optical isolation simultaneously between the pixels. The latter is more advanced, but it's very difficult to fill metal in a deep trench with depth-to-width ratio greater than 10:1. Generally, deep trench filling process comprises depositing a dielectric layer on the surface of the deep trench firstly, depositing a barrier layer secondly, then filling metal, and finally removing the metal on surface.

TSV process of a back-side illuminated CIS is performed on second side of a thinned pixel silicon wafer, TSV lithography, etching and cleaning are performed successively to form a deep trench, then depositing a dielectric protective layer, deep well lithography, etching and cleaning are carried out successively to open a dielectric layer to expose metal, then depositing a barrier layer and a seed layer, and finally filling process and chemical mechanical polishing process are performed.

As mentioned above, in the prior back-side illuminated CIS technology, deep trench and through-silicon via are manufactured respectively, which leads to complicated production steps, and excessive manufacture steps increase manufacturing cost of back-side illuminated CIS products.

SUMMARY

The technical problem to be solved by the present disclosure is to provide an image sensor and a method for manufacturing deep trench and through-silicon via of the image sensor, which reduces manufacturing process steps of the image sensor.

According to one aspect of the present disclosure, the present disclosure provides a method for manufacturing deep trench and through-silicon via of an image sensor, comprising:

Step S01, providing a pixel silicon wafer, which comprises a silicon substrate with pixels and a metal interconnection layer set on the silicon substrate, the metal interconnection layer is set on a first side of the pixel silicon wafer, and a second side of the pixel silicon wafer is opposite to the first side;

Step S02, performing silicon wafer thinning on the second side of the pixel silicon wafer;

Step S03, forming a deep trench on the second side of the pixel silicon wafer;

Step S04, filling the deep trench with organic material;

Step S05, coating photoresist on the second side of the pixel silicon wafer and defining a through-silicon via pattern by lithography;

Step S06, etching the second side of the pixel silicon wafer to form a through-silicon via according to the through-silicon via pattern, removing the photoresist on the second side of the pixel silicon wafer and the organic material in the deep trench;

Step S07, depositing a dielectric protective layer on the surface of the deep trench and the surface of the through-silicon via;

Step S08, filling the deep trench with organic material;

Step S09, coating the photoresist on the second side of the pixel silicon wafer and defining a contact hole pattern by lithography, and the contact hole pattern is located in the through-silicon via pattern;

Steps S10, etching the second side of the pixel silicon wafer to form a contact hole according to the contact hole pattern, removing the photoresist on the second side of the pixel silicon wafer and the organic material in the deep trench, the contact hole expose metal in the metal interconnection layer;

Steps S11, depositing a barrier layer on the surface of the deep trench and the surface of the through-silicon via, filling the deep trench with a first metal, and form a seed layer on the surface of the through-silicon via simultaneously;

Steps S12, filling the through-silicon via with the first metal.

Further, the thickness of the pixel silicon wafer is less than 3 um after the silicon wafer thinning.

Further, in the step S03, the width of the deep trench is 0.2 um-0.3 um, and the depth of the deep trench is 1 um-2 um.

Further, the organic material in the step S04 is as the same as the organic material in the step S07, both of the organic materials have fluidity.

Further, in the step S06 and/or in the step S09, removing the photoresist on the second side of the pixel silicon wafer and the organic material in the deep trench by dry ashing process.

Further, material of the dielectric protective layer is SiO2, Si3N4, SION or SiCN, and the thickness of the dielectric protective layer is 300 Å-500 Å.

Further, material of the barrier layer is Ta, TaN, Ti or TiN, and the thickness of the barrier layer is 150 Å-300 Å.

Further, the first metal is copper, and the seed layer is a continuous copper seed layer.

Further, in the step S11, filling the deep trench with copper by electroless plating, and the copper is filled fully in the deep trench, a continuous copper seed layer is formed in the through-silicon via simultaneously.

Further, in the step S12, filling the through-silicon via with copper by electroplating, and the copper is filled fully in the through-silicon via, removing metal on the surface of the second side of the pixel silicon wafer by copper chemical-mechanical polishing.

Compared with the prior art, the present disclosure adopts a method for manufacturing deep trench and through-silicon via of a back-side illuminated image sensor, which combines dielectric layer and metal filling of the deep trench with that of the through-silicon via together and completed simultaneously. The method reduces process steps of the dielectric layer and metal filling which are high cost, and reduces process cost and equipment configuration. In addition, the present disclosure replaces tungsten filling which used in prior art with copper filling, the copper filling reduces negative influence of metal stress significantly, and improves reliability of an image sensor, especially reliability of a back-side illuminated image sensor.

BRIEF DESCRIPTION OF THE DRAWINGS

The above and other aspects, features and others advantages of the present disclosure will become more apparent by the following detailed exemplary embodiments with reference to the accompanying drawings.

DETAILED DESCRIPTION

Figure 1:
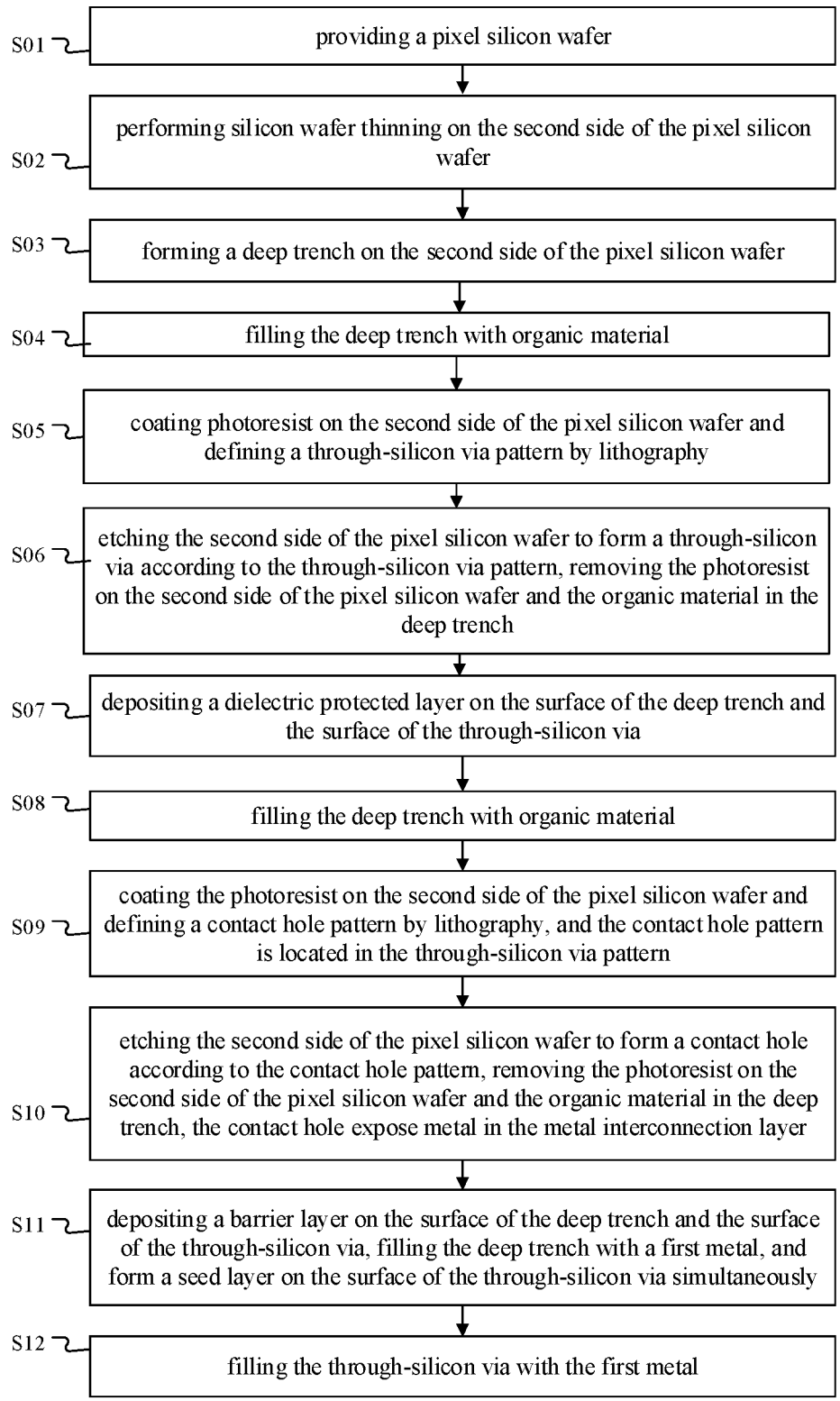
FIG. 1 is a flow chart for a method for manufacturing deep trench and through-silicon via of an image sensor according to an embodiment of the present disclosure Drawings from FIG. 2 to FIG. 9 are phased drawings for a method for manufacturing deep trench and through-silicon via of an image sensor according to an embodiment of the present disclosure

The content of the present disclosure will be further described in detail below in conjunction with the accompanying drawings of the specification. It should be understood that the present disclosure can have various changes on different examples, all of which do not depart from the scope of the present disclosure, and the descriptions and illustrations therein are essentially for illustrative purposes, rather than to limit the present disclosure. It should be noted that the drawings are in a very simplified form and all use inaccurate ratios, which are only used to conveniently and clearly assist the purpose of explaining the embodiments of the present disclosure.

In addition, the drawings are only schematic illustrations of the present disclosure and are not necessarily drawn to scale. Throughout the drawings, the same or like references numerals will be used to designate the same or like elements. Some of the block diagrams shown in the drawings are functional entities and do not necessarily correspond to physically or logically independent entities. These functional entities may be implemented in software form, in one or more hardware modules or integrated circuits, or in different networks and/or processor devices and/or microcontroller devices.

Hereinafter, embodiments of the present disclosure will be described in detail with reference to the accompanying drawings. The various advantages of the present disclosure will become apparent to one skilled in the art by reading the following specification and subjoined claims and by referencing the following drawings. FIG. 1 is a flow chart for a method for manufacturing deep trench and through-silicon via of an image sensor according to an embodiment of the present disclosure. Drawings from FIG. 2 to FIG. 9 are phased drawings for a method for manufacturing deep trench and through-silicon via of an image sensor according to an embodiment of the present disclosure.

Figure 2:
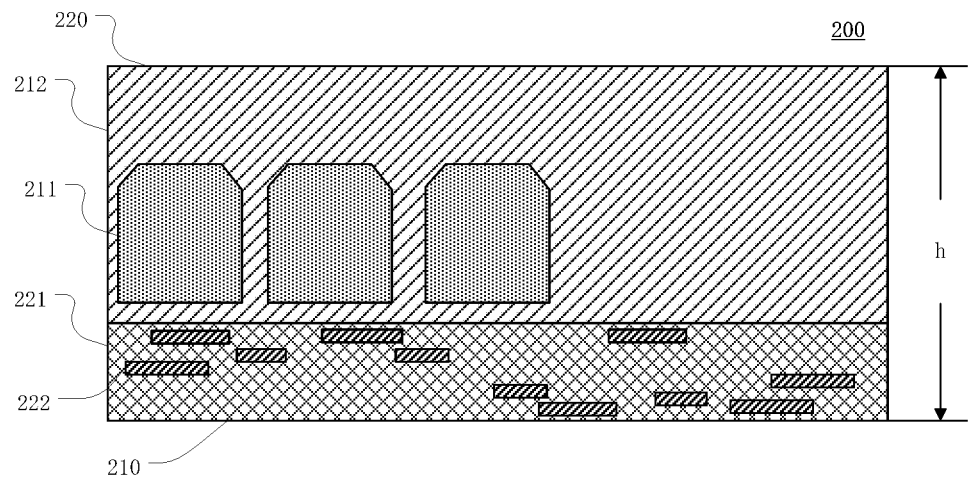

As shown in FIG. 1, 11 steps are shown in FIG. 1, refer to FIG. 2-FIG. 9 in combination with FIG. 1:

As shown in FIG. 2, which is a phased drawing for step S01. In the step S01, providing a pixel silicon wafer 200, which comprises a silicon substrate 212 with pixels 211 and a metal interconnection layer 221 set on the silicon substrate 212, the metal interconnection layer 221 is set on a first side 210 of the pixel silicon wafer 200, and a second side 220 of the pixel silicon wafer 200 is opposite to the first side 210.

In step S02, performing silicon wafer thinning to the silicon substrate 212 on the second side 220 of the pixel silicon wafer 200.

As shown in FIG. 2, silicon wafer thinning is performed to the silicon substrate 212 on the second side 220 of the pixel silicon wafer 200. The pixels 211 are photosensitive units which are very sensitive to light, the pixels 211 capture photons and convert optical signal into electrical signal, and the electrical signal is transmitted to CMOS devices by charge accumulation, then amplified and converted into digital signal by a peripheral circuit.

The second side 220 of the pixel silicon wafer 200 is thinned in the Step S02, and the final thickness of the pixel silicon wafer 200 is h, which is controlled within 3 um. In the step S01, firstly, the pixel silicon wafer 200 is thinned to about 30 um by conventional back mechanical polishing (quick back polishing is performed at first, and the thickness of the pixel silicon wafer 200 is reduced from 775 um to about 150 um by diamond knife, then CMP process is used for fine polishing to control the uniformity and surface defects of the pixel silicon wafer 200, and the thickness of the pixel silicon wafer 200 is controlled to about 30 um); secondly, multi-step wet etching processes are performed to reduce the thickness of the pixel silicon wafer 200 to within 3 um, a strong acid with high oxidization is used for selective etching firstly, and the end point of the wet etching is controlled accurately by controlling the doping state of the pixel silicon 200; Then, the second side 220 of the pixel silicon wafer 200 is isotropic etched by a TMAH (Tetramethylammonium hydroxide) solution, and finally the thickness of the pixel silicon wafer 200 is controlled within 3 um.

Forming a deep trench on the backside of the pixel silicon wafer in step S03.

Figure 3:
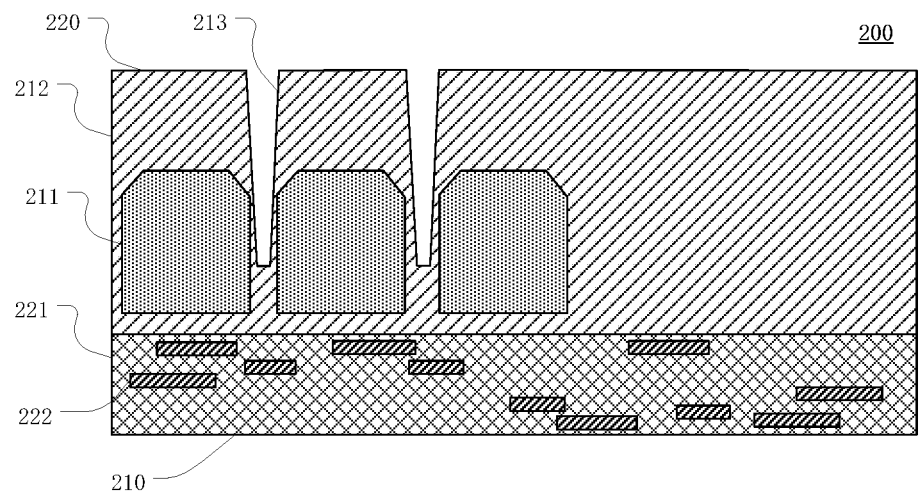

As shown in FIG. 3, which is a phased drawing for the step S03. A deep trench 213 is formed on the second side 220 thinned of the pixel silicon wafer 200. Isolation technology of the deep trench 213 is one of key technologies for image sensor, since photosensitive units of the pixels 211 receive external light signal, electrical signal is generated, electronic drift phenomenon occurs in a certain chance during charge accumulation, electrons are captured by the adjacent pixels 211 and lead to crosstalk between the pixels 211 and then affect image resolution, so the deep trench 213 is formed between the pixels 211 to eliminate electrical signal interference. The formation of the deep trench 213 is similar to formation of a through-silicon via, a deep trench pattern is defined around each pixel 211 by lithography, and a deep trench with a high aspect ratio is obtained by silicon etching. The silicon etching is a typical deep silicon etching (Bosch process) which comprises a silicon etching step and a sidewall passivation step, the deep trench 213 with relatively flat sidewall is formed by repeating the two steps. Then, wet cleaning is carried out to the deep trench 213, generally, a conventional cleaning solution is used, such as HCl/H2O2/H2O or NH4OH/H2O2/H2O mixed solution. According to the size of the pixels 211, the physical size of the deep trench 213 is designed reasonably. In a preferred embodiment of the present disclosure, the width of the deep trench is 0.2 um-0.3 um, and the depth of the deep trench is 1 um-2 um.

In step S04, filling the deep trench 213 with organic material 230.

In step S05, coating photoresist 240 on the second side 220 of the pixel silicon wafer 200 and defining a through-silicon via pattern by lithography.

Figure 4:
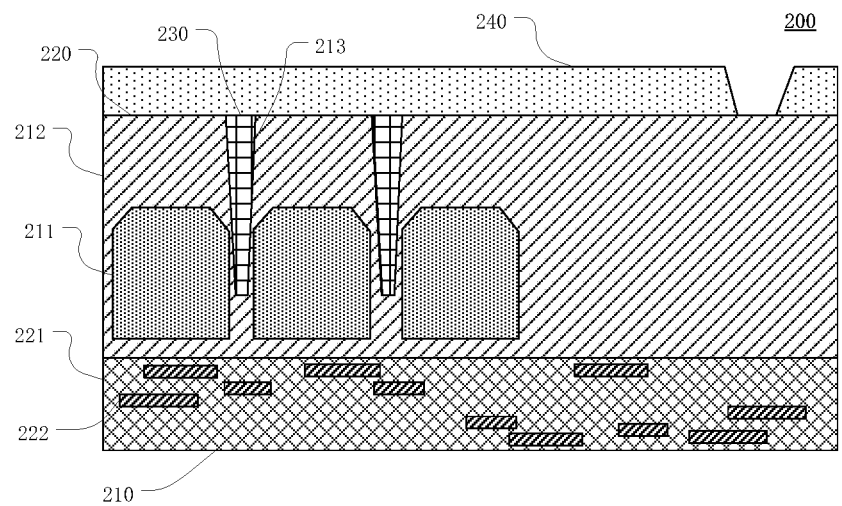

As shown in FIG. 4, which is a phased drawing for the step S04 and the step S05, filling the deep trench 213 with the organic material 230 and coating the photoresist 240, then carrying out lithography of a through-silicon via 214. The organic material 230 are spin coated on the second side 220 of the pixel silicon wafer 200, the organic material 230 has fluidity and can be filled fully in the deep trench 213. Then, coating the photoresist 240 for the lithography of the through-silicon via 214, because the depth of the through-silicon via 214 is close to 3 um, the thickness of the photoresist 240 is more than 2 um. Further, the lithography of the through-silicon via 214 is carried out to define a through-silicon via pattern, the diameter of the through-silicon via 214 is 3 um-15 um.

In step S06, etching the second side 220 of the pixel silicon wafer 200 to form the through-silicon via 214 according to the through-silicon via pattern, removing the photoresist 240 on the second side 220 of the pixel silicon wafer 200 and the organic material 230 in the deep trench 213.

Figure 5:
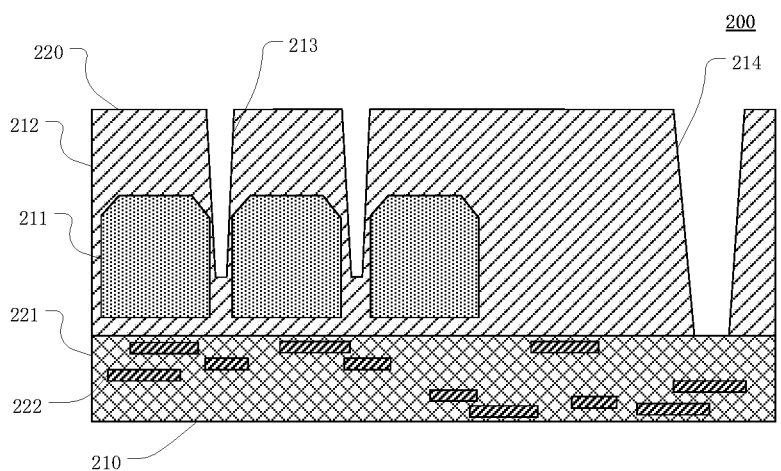

As shown in FIG. 5, which is a phased drawing for the step S06. Etching and cleaning of the through-silicon via 214 are carried out to form the through-silicon via 214. The etching of the through-silicon via 214 is performed to the organic material 230, the organic material 230 on the surface of the pixel silicon wafer 200 are etched firstly, and then under the protection of the photoresist 240, silicon etching is carried out by Boach process, by repeating a silicon etching step and a sidewall passivation step, the silicon substrate 212 of the pixel silicon wafer 200 is etched and penetrated, and the silicon etching is stopped at pre-metal dielectric of the metal interconnection layer 221 of the pixel silicon wafer 200, and formed the through-silicon via 214 with inverted trapezoid shape. Then, oxygen is used for rapid ashing treatment and the organic material 230 in the deep trench 214 is removed completely simultaneously. Wet cleaning is carried out to the second side 220 of the pixel silicon wafer 200. Generally, a conventional cleaning solution is used, such as HCl/H2O2/H2O or NH4OH/H2O2/H2O mixed solution.

In step S07, a dielectric protective layer 250 is deposited on the surface of the deep trench 213 and the surface of the through-silicon via 214.

In step S08, the organic material 230 is filled in the deep trench 213.

In step S09, coating the photoresist 240 on the second side 220 of the pixel silicon wafer 200 and defining a contact hole pattern by lithography, and the contact hole pattern is located in the through-silicon via pattern.

Figure 6:
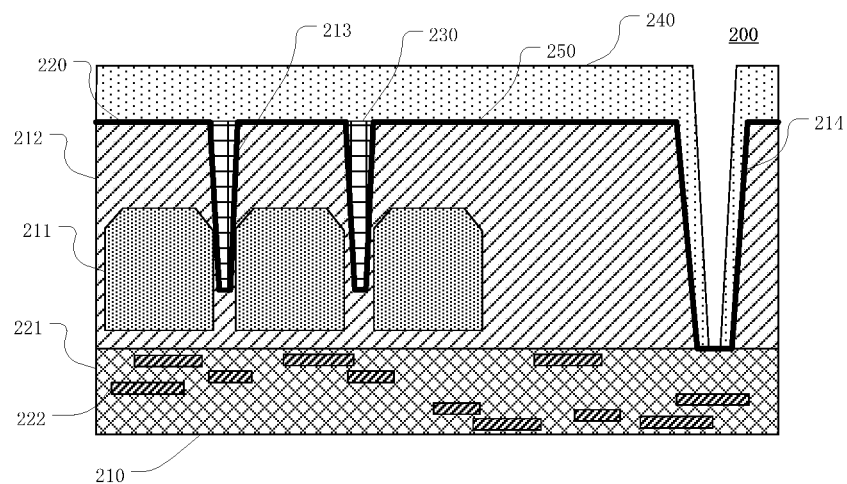

As shown in FIG. 6, which is a phased drawing from step S07 to step S09. The dielectric protective layer 250 is deposited on the surface of the deep trench 213 and the surface of the through-silicon via 214. Because the photosensitive units are very sensitive to metal impurities, after exposing the deep trench 213 and the through-silicon via 214, the dielectric protective layer 250 is deposited to protect the silicon substrate 212 and repair damages of the silicon substrate 212 caused by etching. Because the width of the deep trench 213 is very small, material of the dielectric protective layer 250 is SiO2 dielectric as a selection, and the thickness of the dielectric protective layer 250 is 300 Å-500 Å. The dielectric protective layer 250 is required to cover the surface of the deep trench 213 and the surface of the through-silicon via 214 evenly, in an embodiment, atomic layer deposition technology is used to deposit a uniform SiO2 layer. In other embodiments, material of the dielectric protective layer 250 can be Si3N4, SION, SiCN or other dielectrics.

As shown in FIG. 6, filling the deep trench 213 with the organic material 230 firstly, then coating the photoresist 240 and performing deep well lithography of a contact hole 215. Similar to the step S03 and the S04, the second side 220 of the pixel silicon wafer 200 is spin coated with the organic material 230 until the deep trench 213 is filled fully. Coating the photoresist 240 that used for the lithography of the contact hole 215, the photoresist 240 is filled in the through-silicon via 214, the thickness of the photoresist 240 is determined by a dielectric layer needs to be etched in the subsequent etching process. For example, the contact hole 215 is connected to metal 222 of the pixel silicon wafer 200, a dielectric layer, which needs to be etched comprises a SiO2 dielectric protective layer and a pre-metal dielectric layer, the thickness of the dielectric layer is about 4000 Å, so the thickness of the photoresist 240 is at least 6000 Å, reasonable thickness of the photoresist 240 is evaluated by actual coating process. Then, deep well lithography of the contact hole 215 is carried out, lithography is focus on the bottom of the contact hole 215 and the diameter of the contact hole 215 is controlled in the range of 2 um-3 um.

In step S10, etching the second side 220 of the pixel silicon wafer 200 to form the contact hole 215 according to the contact hole pattern, removing the photoresist 240 on the second side 220 of the pixel silicon wafer 200 and the organic material 230 in the deep trench 213, the contact hole 215 exposes the metal 222 in the metal interconnection layer 211.

Figure 7:
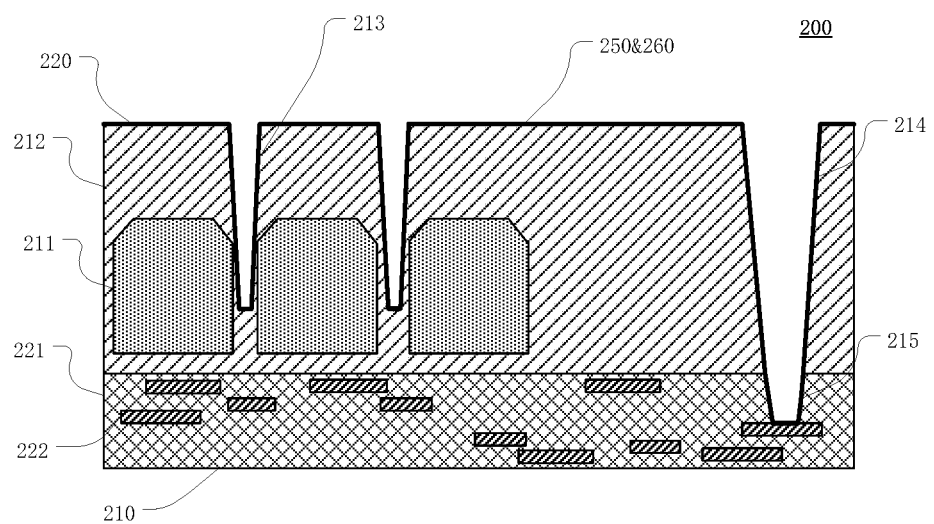

As shown in FIG. 7, which is a phased drawing for the step S10. Etching and cleaning of the contact hole 215 (the contact hole 215 is at the bottom of the through-silicon via 214 and as a part of the through-silicon via 214) are performed to expose the metal 222 in the metal interconnection layer 211 of the pixel silicon wafer 200. Under the protection of the photoresist 240, etching of the contact hole 215 is carried out to etch a dielectric layer at the bottom of the through-silicon via 214, taking the metal 222 for example, the etching of the contact hole 215 comprises etching the organic material 230 firstly, then etching a SiO2 dielectric protective layer and a pre-metal dielectric layer successively, and stopping at surface of Ta(N) protective layer of the metal 222. Then, wet cleaning is carried out after etching. Generally, an organic cleaning solution with less corrosion to metal is selected, such as ST250 or EKC series cleaning solution.

In step S11, depositing a barrier layer 260 on the surface of the deep trench 213 and the surface of the through-silicon via 214, filling the deep trench 213 with a first metal 270, and form a seed layer on the surface of the through-silicon via 214 simultaneously.

Figure 8:
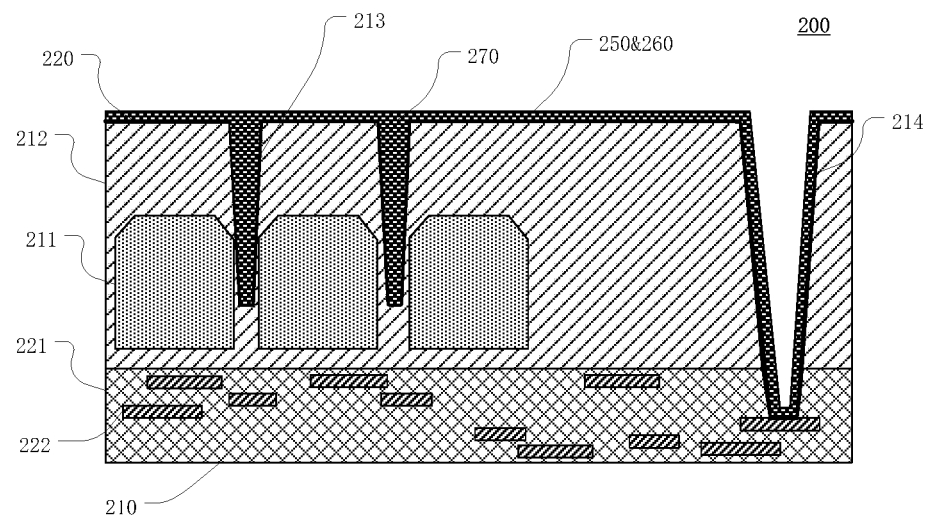

As shown in FIG. 8, which is a phased drawing for the step S11. Depositing a barrier layer 260 on the surface of the deep trench 213 and the surface of the through-silicon via 214, filling the deep trench 213 with the first metal 270 (the first metal 270 is, e.g., copper), and form a seed layer on the surface of the through-silicon via 214 simultaneously. Depositing a metal barrier layer 260 before the metal filling, optional materials of the metal barrier layer 260 include Ta, TaN, Ti or TiN, and the thickness of the metal barrier layer 260 is 150 Å-300 Å. The metal barrier layer 260 is usually deposited by magnetron sputtering, because the depth-to-width ratio of the deep trench 213 is much larger than that of the through-silicon via 214, so it is difficult to obtain ideal step coverage in magnetron sputtering, therefore, atomic layer deposition process is used to form the metal barrier layer 260 which is uniform and continuous. Then, the deep trench 213 is filled with copper 270 by electroless plating. The electroless plating has strong filling ability which can fill the deep trench 213 quickly, and a copper layer is deposited in through-silicon via 214 to form a copper seed layer simultaneously. Thickness of electroless copper is determined by the filling process of the deep trench 213, in a preferred embodiment of the present disclosure, the thickness of the copper layer filled in the deep trench 213 is 3000 Å-6000 Å.

In step S12, filling the through-silicon via 214 with the first metal 270.

Figure 9:
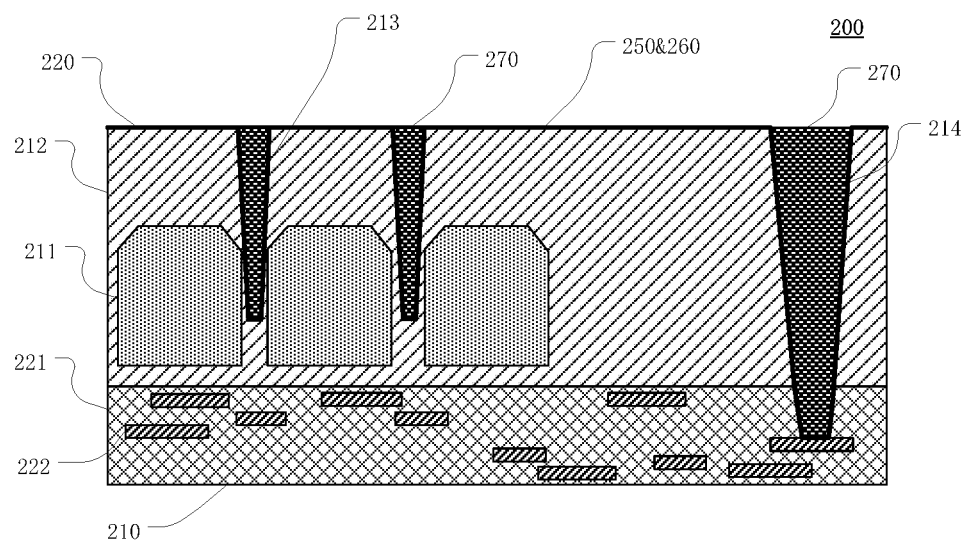

As shown in FIG. 9, which is a phased drawing for the step S12. Filling the through-silicon via 214 with the first metal 270 (the first metal 270 is, e.g., copper), metal on surface is removed by copper chemical-mechanical polishing. Filling the through-silicon via 214 fully with copper by electroplating, thickness of electroplating copper is controlled between 2 um-3 um, which can be assessed by effects of the copper filling to ensure the through-silicon via 214 is filled fully with copper. Then, chemical-mechanical polishing is performed to remove metal on surface and stopped at a SiO2 dielectric protective layer.

Compared with the prior art, the present disclosure adopts a method for manufacturing deep trench and through-silicon via of a back-side illuminated image sensor, which combines dielectric and metal filling of the deep trench with that of the through-silicon via together and completed simultaneously. The method reduces process steps of the dielectric layer and metal filling which are high cost, and reduces process cost and equipment configuration. In addition, the present disclosure replaces tungsten filling which used in prior art with copper filling, the copper filling reduces negative influence of metal stress significantly, and improves reliability of an image sensor, especially reliability of a back-side illuminated image sensor.

Other embodiments of the disclosure will be apparent to those skilled in the art from consideration of the specification and practice of the disclosure here. This application is intended to cover any variations, uses, or adaptations of the disclosure following the general principles thereof and including such departures from the disclosure as come within known or customary practice in the art. It is intended that the specification and embodiments be considered as exemplary only, with a true scope and spirit of the disclosure being indicated by the following claims.

What is claimed is:

1. A method for manufacturing deep trench and through-silicon via of an image sensor, comprising:
    Step S01, providing a pixel silicon wafer, which comprises a silicon substrate with pixels and a metal interconnection layer set on the silicon substrate, the metal interconnection layer is set on a first side of the pixel silicon wafer, and a second side of the pixel silicon wafer is opposite to the first side;
    Step S02, performing silicon wafer thinning on the second side of the pixel silicon wafer;
    Step S03, forming a deep trench on the second side of the pixel silicon wafer;
    Step S04, filling the deep trench with organic material;
    Step S05, coating photoresist on the second side of the pixel silicon wafer and defining a through-silicon via pattern by lithography;
    Step S06, etching the second side of the pixel silicon wafer to form a through-silicon via according to the through-silicon via pattern, removing the photoresist on the second side of the pixel silicon wafer and the organic material in the deep trench;
    Step S07, depositing a dielectric protective layer on the surface of the deep trench and the surface of the through-silicon via;
    Step S08, filling the deep trench with organic material;
    Step S09, coating the photoresist on the second side of the pixel silicon wafer and defining a contact hole pattern by lithography, and the contact hole pattern is located in the through-silicon via pattern;
    Steps S10, etching the second side of the pixel silicon wafer to form a contact hole according to the contact hole pattern, removing the photoresist on the second side of the pixel silicon wafer and the organic material in the deep trench, the contact hole exposes metal in the metal interconnection layer;
    Steps S11, depositing a barrier layer on the surface of the deep trench and the surface of the through-silicon via, filling the deep trench with a first metal, and form a seed layer on the surface of the through-silicon via simultaneously;
    Steps S12, filling the through-silicon via with the first metal.

2. The method of claim 1, wherein the thickness of the pixel silicon wafer is less than 3 um after the silicon wafer thinning.

3. The method of claim 1, wherein in the step S03, the width of the deep trench is 0.2 um-0.3 um, and the depth of the deep trench is 1 um-2 um.

4. The method of claim 1, wherein the organic material in the step S04 is the same as the organic material in the step S07, both of the organic materials have fluidity.

5. The method of claim 1, wherein in the step S06 and/or in the step S09, removing the photoresist on the second side of the pixel silicon wafer and the organic material in the deep trench by dry ashing process.

6. The method of claim 1, wherein material of the dielectric protective layer is SiO2, Si3N4, SiON or SiCN, and the thickness of the dielectric protective layer is 300 Å-500 Å.

7. The method of claim 1, wherein material of the barrier layer is Ta, TaN, Ti or TiN, and the thickness of the barrier layer is 150 Å-300 Å.

8. The method of claim 1, wherein the first metal is copper, and the seed layer is a continuous copper seed layer.

9. The method of claim 8, wherein in the step S11, filling the deep trench with copper by electroless plating, and the copper is filled fully in the deep trench, a continuous copper seed layer is formed in the through-silicon via simultaneously.

10. The method of claim 8, wherein in the step S12, filling the through-silicon via with copper by electroplating, and the copper is filled fully in the through-silicon via, removing metal on the surface of the second side of the pixel silicon wafer by copper chemical-mechanical polishing.

\* \* \* \* \*